United States Patent [19]
Aoki

[11] Patent Number: 5,345,103
[45] Date of Patent: Sep. 6, 1994

[54] GATE CONTROLLED AVALANCHE BIPOLAR TRANSISTOR

[75] Inventor: Kenji Aoki, Tokyo, Japan

[73] Assignee: Seiko Instruments Inc., Tokyo, Japan

[21] Appl. No.: 953,308

[22] Filed: Sep. 29, 1992

Related U.S. Application Data

[63] Continuation of Ser. No. 668,497, May 13, 1991, abandoned.

[30] Foreign Application Priority Data

Jul. 18, 1989 [JP] Japan ................... 1-186683

[51] Int. Cl.⁵ ............... H01L 29/74; H01L 29/784; H01L 29/90
[52] U.S. Cl. ................... 257/589; 257/367
[58] Field of Search .............. 357/23.3, 23.12, 23.13, 357/13, 34, 35; 257/589, 361, 362, 367

[56] References Cited

U.S. PATENT DOCUMENTS

| | | | |
|---|---|---|---|
| 4,131,908 | 12/1978 | Daub et al. | 357/23.13 |
| 4,242,691 | 12/1980 | Kotani et al. | 357/23.12 |
| 4,697,198 | 9/1987 | Komari et al. | 357/23.12 |
| 4,868,621 | 9/1989 | Miyamoto | 357/23.13 |

FOREIGN PATENT DOCUMENTS

| | | |
|---|---|---|
| 0088389 | 9/1983 | European Pat. Off. |
| 0161446 | 11/1985 | European Pat. Off. |
| 55-13591 | 4/1980 | Japan |
| 1-140772 | 6/1989 | Japan |

*Primary Examiner*—William D. Larkins
*Attorney, Agent, or Firm*—Spensley Horn Jubas & Lubitz

[57] ABSTRACT

An insulated gate controlled avalanche bipolar transistor has a heavily doped (with doping of at least $1 \times 10^{18}$ cm$^{-3}$) substrate and a lightly doped channel layer of the same conductivity type on the substrate. The source/emitter and drain/collector regions extend through the lightly doped surface layer to reach the heavily doped substrate, so that the junction between the drain and the heavily doped substrate promotes avalanche breakdown. A lightly doped region of the same type as the substrate is provided betwen the heavily doped substrate and the contact to the substrate, to provide a resistance between the substrate, which acts as the base of the transistor, and the substrate contact, to permit biasing of the base by resistive voltage drop across the resistance, while the lightly doped channel layer permits a low FET threshold voltage. The lightly doped resistance region may be located on the bottom of the substrate or on the top surface laterally spaced from the source/emitter and drain/collector regions.

8 Claims, 4 Drawing Sheets

GATE CONTROLLED AVALANCHE BIPOLAR TRANSISTOR

This is a continuation of application Ser. No. 07/668,497 filed on May 13, 1991, now abandoned.

FIELD OF THE INVENTION

The present invention relates to a semiconductor device, and especially relates to a metal-insulator-semiconductor field effect transistor (hereinafter called MISFET) utilized as a switching element in a computer and characterized by a high-speed operation.

The present invention employs a substrate having a high impurity concentration to enhance the field strength between the substrate and a drain. In addition, a high-resistance load is provided in series between a semiconductor region (a semiconductor substrate or a well) and a substrate electrode in order to cause a rapid increase in drain current that is triggered by an impact ionization phenomenon occurring in the vicinity of the drain at the same time as a MIS transistor operation starts, thereby realizing a high current driving capability.

BACKGROUND OF THE INVENTION

In a conventional MIS transistor, as shown in FIG. 2, a gate insulating film 25 and a gate electrode 26 are formed on a semiconductor substrate 21 successively in a mentioned order, and a source 23 and a drain 24 are formed by ion implantation.

In order to cause the above described phenomenon in the MOS transistor having the conventional structure, the channel length L must be small and the operating voltage must be high ($V_D \geq 10$ V) as reported, for example, in IEEE, EDL-8, No. 7, July, 1987.

Accordingly, as long as it is used at an ordinary power supply voltage (5 V or lower), the MIS transistor having the conventional structure can realize only such a limited current driving capability that is dependent on the power supply voltage V, device size W/L, carrier mobility $\mu$, etc.

An object of the present invention is to enable the phenomenon, which occurs only when the channel is short and the power supply voltage is high in the prior art, to occur even when the power supply voltage is low and the channel is long.

DISCLOSURE OF THE INVENTION

Accordingly, the present invention adopts means described below in order to enable the phenomenon, which occurs only when the channel is short and the power supply voltage is high in the prior art, to occur even when the power supply voltage is low and the channel is long. First, the impurity concentration in a semiconductor region (which is a substrate or a well) is raised to reduce the width of the depletion layer between a drain and a substrate, thereby enabling the impact ionization phenomenon to occur satisfactorily, even when the drain voltage $V_D$ is 5 V or lower. Second, a high-resistance layer is provided between the semiconductor region and a substrate electrode (That is, an electrode for applying the potential of the semiconductor region or the well, and hereinafter thus defined.) thereby obtaining a structure in which holes or electrons are readily accumulated in the substrate, and thus causing minority carrier (electron) injection from a source. Third, a low impurity concentration region is provided as a channel in the substrate surface region in order to prevent a rise in Vth due to the use of semiconductor region having a high impurity concentration.

By adopting the above described means, the present invention realizes an extremely high current driving capability by virtue of the effect of the minority carrier injection from the source that is triggered by an impact ionization phenomenon that occurs in the vicinity of the drain at a power supply voltage that is generally used and without depending upon the device size.

THE BEST MODE FOR CARRYING OUT THE INVENTION

Hereinafter, the present invention is described in detail with reference to FIGS. 1, 3, 4, and 7.

Figure 1:
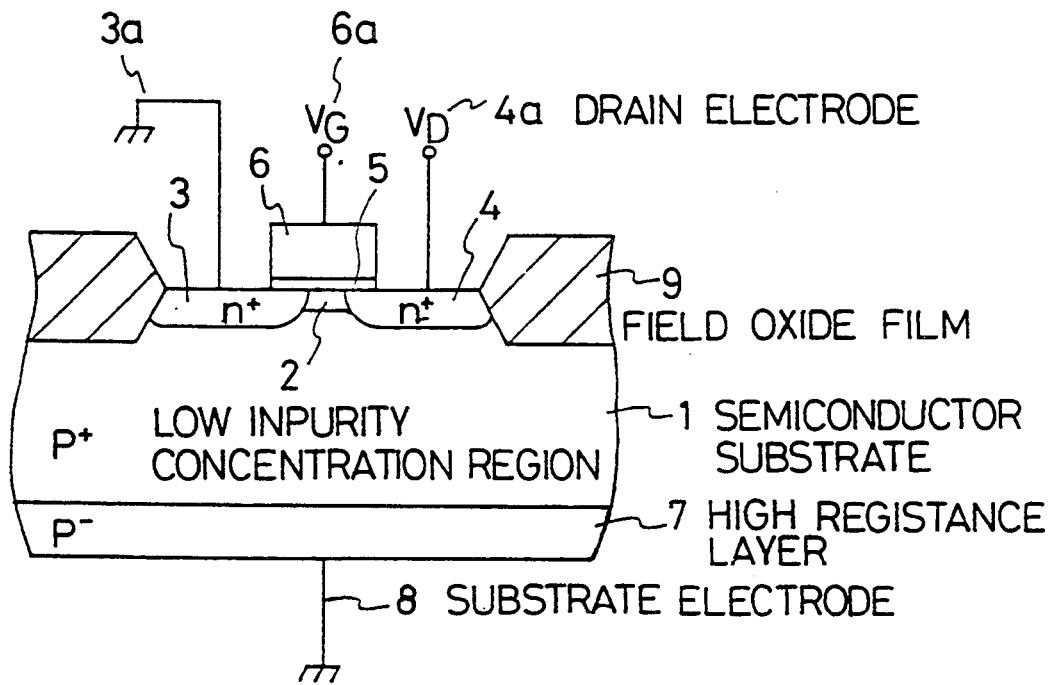
FIG. 1 is a cross-sectional view showing a structure of a first embodiment of a semiconductor device according to the present invention.

FIG. 1 is a cross-sectional view showing a structure of a first embodiment of a semiconductor device according to the present invention. A semiconductor substrate 1 having a high impurity concentration is a P+ type substrate doped with, for example, boron, at a concentration of $1 \times 10^{18}$ cm$^{-3}$ or more. A low-impurity region 2 is a P− type region having a boron concentration of $1 \times 10^{16}$ cm$^{-3}$ or less, for example, and has a thickness of about 1,000 Å or less. A source 3 and a drain 4 have been provided by use of ion implantation after the formation of a gate electrode 6 that is provided through a gate oxide film 5 which serves as a gate insulating film. A high-resistance layer 7 that is provided on the reverse side of the semiconductor substrate 1 is formed by predeposition of phosphorus on the reverse side of the semiconductor substrate 1. Not only an impurity diffusion layer but also an insulating film, such as a SiO$_2$ film, a SiN film, an Si$_3$N$_4$ film and a Ta$_2$O$_5$ film may be employed as the high-resistance layer 7 so as to serve as a resistance.

Figure 3:
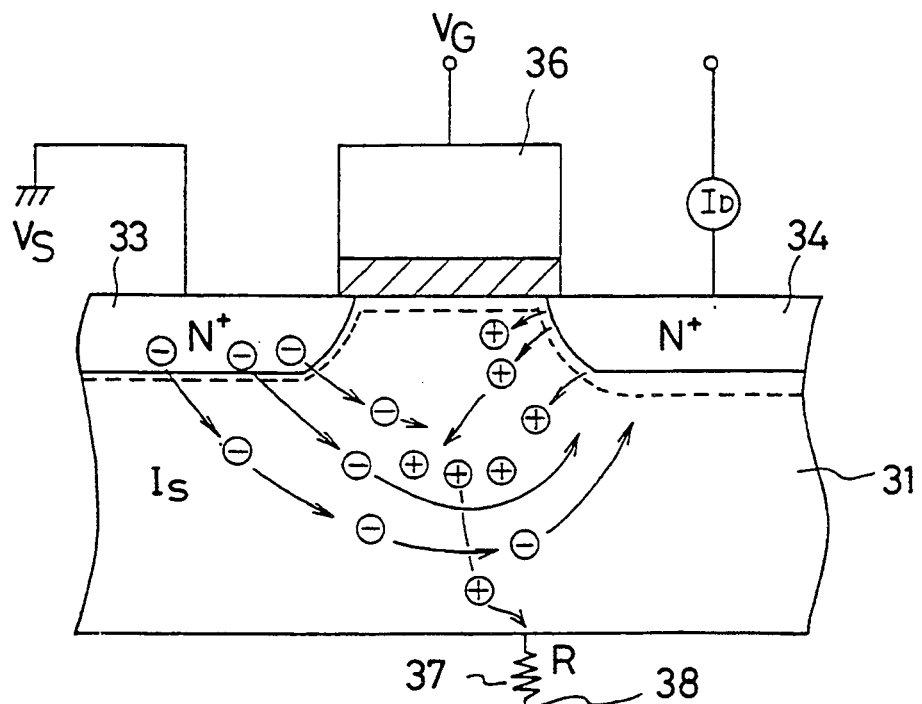
FIG. 3 is a diagram showing a current path in the semiconductor device shown in FIG. 1.
Figure 4:
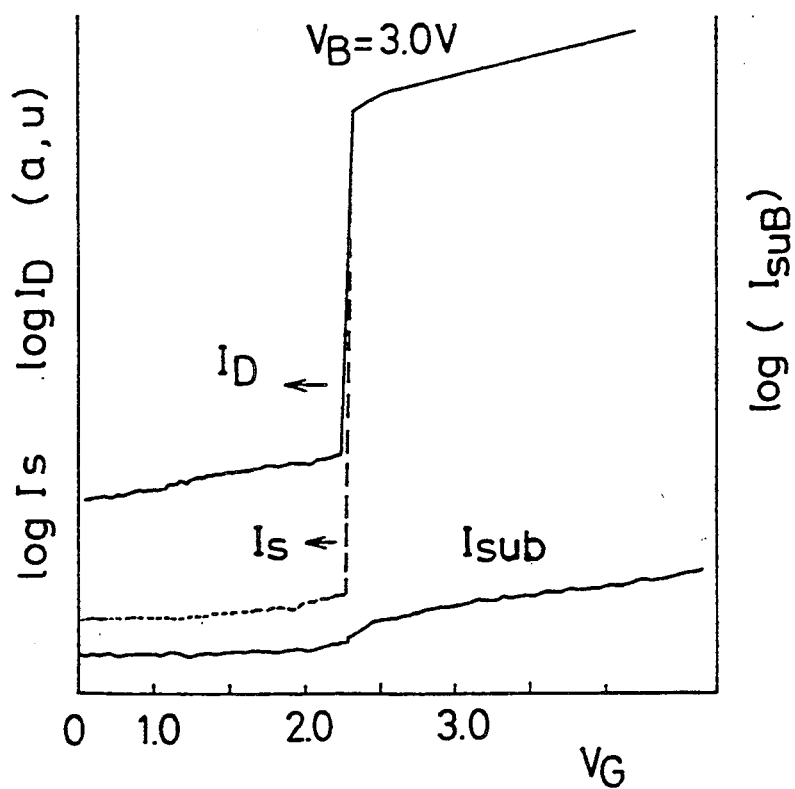
FIG. 4 is a graph showing the current-voltage characteristics of the semiconductor device shown in FIG. 1.
Figure 5:
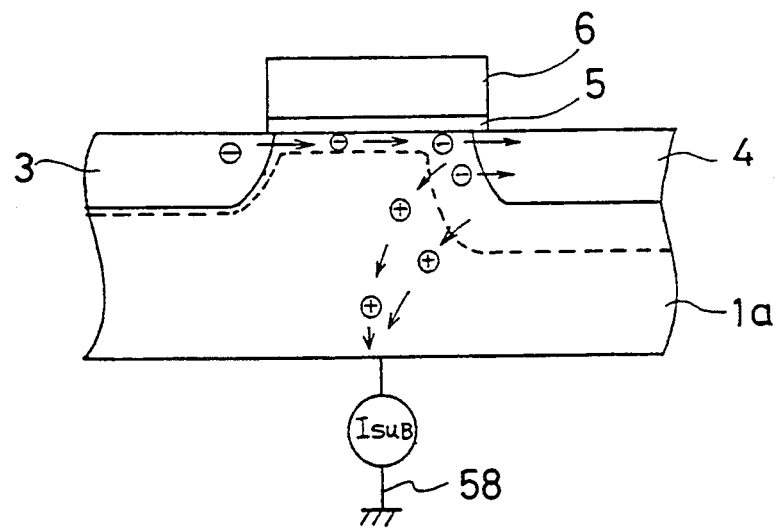
FIG. 5 is a diagram showing a current path in the MOS transistor shown in FIG. 2.

FIG. 3 is a current path chart showing the operating principle of the semiconductor device according to the present invention. Electrodes include a source electrode 33, a drain electrode 34, a gate electrode 36, and a substrate electrode 31, among which the source electrode 33 is directly grounded and the substrate electrode 31 is grounded through a resistor R. The operating principle of the semiconductor device according to the present invention will be explained below by use of FIG. 3. In case where the drain voltage is constant, i.e., $V_D = 5$ V, when the gate voltage $V_G$ is 0V, no channel is formed, but a potential barrier of 5 V alone is formed between the source and the substrate. Even when the channel is long (L$\geq$2 $\mu$m), if the gate voltage $V_G \geq V_{th}$ (threshold voltage), a channel is formed, so that electrons are supplied from the source to the drain. At this time, some of the electrons become hot electrons at the side end portion of the drain, causing impact ionization, thus generating electron-hole pairs in the form of avalanche. At this time, holes (in case of an N channel transistor) are injected into the substrate and flow to the substrate electrode 58 in the form of a substrate current $I_{SUB}$, as shown in FIG. 5. In the present invention, however, since the resistor R is provided just before the substrate electrode, holes (in case of a P channel transistor, electrons) are readily accumulated inside the substrate, so that the substrate potential is raised. Accordingly, the source and the substrate perform a forward operation, so that minority carriers (electrons) are injected into the substrate from the source. Some of the electrons injected from the source reach the drain while causing recombination to contribute as the drain current. As the sum total of the above described phenomena, a rapid increase in drain current occurs, as shown in FIG. 4. FIG. 4 shows an example in which the above described phenomenon occurs when the drain voltage $V_D$ is around 3.0 V and the gate voltage $V_G$ is around 1.75 V in the case of W/L=20/10.

Figure 2:
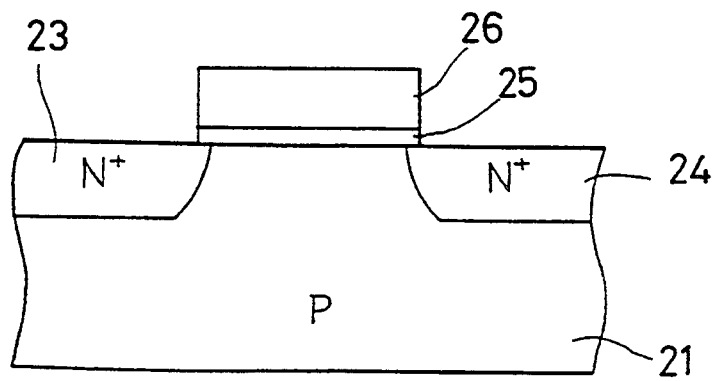
FIG. 2 is a cross-sectional view showing a structure of a conventional MOS transistor.
Figure 6:
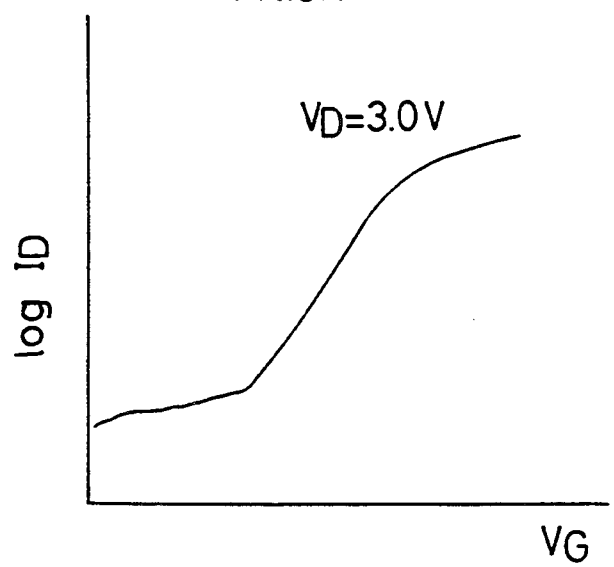
FIG. 6 is a graph showing the current-voltage characteristics of the MOS transistor shown in FIG. 2.

Thus, in the present invention an extremely high mutual conductance, which has heretofore been unavailable, is obtained at a drain voltage and a gate voltage, which are not higher than 5 V. Incidentally, FIGS. 2, 5, and 6 are a cross-sectional view showing the structure of a conventional MOSFET, a current path chart thereof, and a graph showing the current-voltage characteristics thereof, respectively. In a structure such as shown in FIG. 2, since the width of the depletion layer between the semiconductor substrate 1a and the drain 4 is large, as shown in FIG. 5, substantially no impact ionization occurs at the drain end when the power supply voltage is at an ordinary level, so that a rapid increase in drain current such as seen in FIG. 4 is not recognized in FIG. 6.

Figure 7:
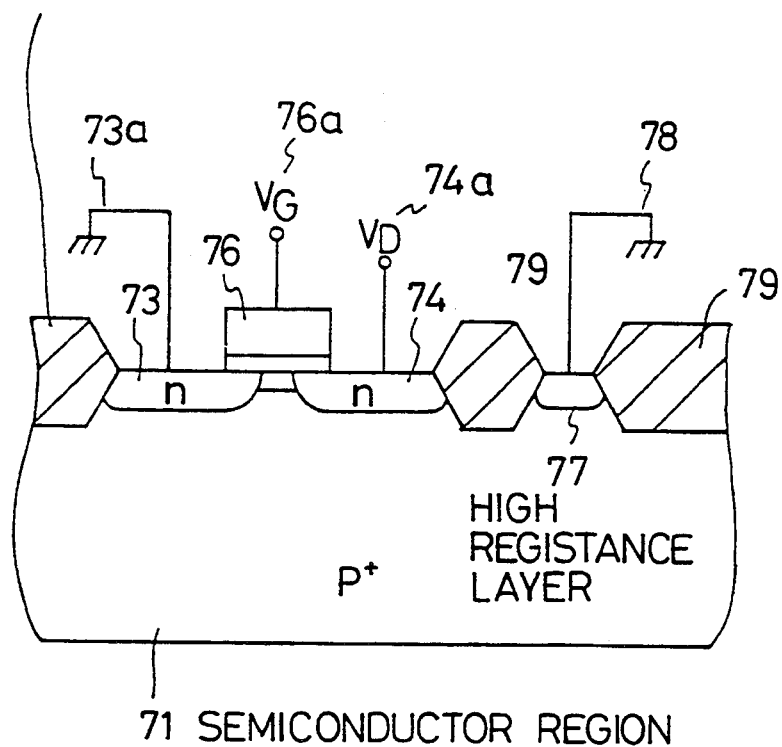
FIG. 7 is a cross-sectional view of a structure of a semiconductor device of a second embodiment according to the present invention.

FIG. 7 is a cross-sectional view of a structure of a second embodiment according to the present invention. In this embodiment, a high-resistance layer 77 is not provided on the reverse side of a substrate 71 as in the first embodiment, but on the surface side of the substrate as a diffusion layer. Even in this case, the impurity concentration in the high resistance layer is lower than that in the semiconductor region 71. Adopting this structure may also realize exactly the same effect as in the structure of the semiconductor device shown in FIG. 1.

As clearly understood according to the above description, it is not necessary to provide the high resistance layer on the reverse side or on the surface side of the semiconductor substrate when carrying out the present invention. Substantially important thing is, however, to provide a resistance of any form (including an external resistance if the situation allows) between the substrate and the ground electrode, thereby obtaining the structure wherein majority carriers are readily accumulated in the substrate.

These high resistance regions 37 and 77 are meant to have a function to make the holes or the electrons caused in the vicinity of the drains hardly run away from the substrates 1, 31 and 71 to the substrate electrodes 8, 38, and 78 (that is, electrodes for applying potentials to the semiconductor regions.) Therefore, the resistance of these high resistance regions need to be larger than that of the semiconductor regions 1, 31, and 71.

As has been described above, it is possible according to the present invention to produce a semiconductor device that is characterized by a high speed operation, which has heretofore been unavailable, by utilizing the effect of the minority carrier injection into the substrate.

What is claimed is:

1. A semiconductor device comprising: a semiconductor substrate of a first conductivity type, said substrate having a surface and containing a channel region formed in the surface of said substrate, said substrate having a first impurity concentration equal to or greater than $1 \times 10^{18}$ cm$^{-3}$ and said channel region having a second impurity concentration which is lower than said first impurity concentration; source and drain regions of a second conductivity type different from the first conductivity type, with said channel region and said substrate being disposed between said source and drain regions, and said source and drain regions being in contact with said substrate; a gate insulating film formed on said channel region; a gate electrode formed on said gate insulating film; a grounded substrate electrode; and a resistance layer formed between said substrate and said substrate electrode so as to be electrically in series with said substrate and said substrate electrode, wherein said device is constructed such that when selected potentials are applied to said source and drain regions and to said gate electrode to place said device into operation, said substrate defines a path for current flow between said source and drain regions, carriers are injected from said source region into said substrate, an impact ionization phenomenon occurs in said substrate at a location in the vicinity of said drain region in order to trigger injection of carriers from said source region into said substrate, and carriers injected from said drain region accumulate in said substrate, due to the presence of said resistance layer, so as to increase the potential of said substrate.

2. A semiconductor device according to claim 1; wherein said resistance layer is provided on the reverse side of said first conductivity type semiconductor substrate.

3. A semiconductor device according to claim 1; wherein said resistance layer is provided at said surface of said first conductivity type semiconductor substrate.

4. A semiconductor device according to claims 1 or 2 or 3; wherein said resistance layer is an impurity diffusion layer of the first conductivity type having a net impurity concentration lower than said first impurity concentration.

5. A semiconductor device according to claim 1; wherein said channel has a depth of 1,000 Å or less.

6. A semiconductor device according to claim 1 wherein said source and drain regions are formed in said substrate.

7. A semiconductor device according to claim 1 having a structure wherein the channel region has a length of 2 μm or more and the selected potential as applied to said drain region is 5 V or lower.

8. A semiconductor device according to claim 1 wherein said second impurity concentration is equal to or lower than $1 \times 10^{16}$ cm$^{-3}$.

* * * * *